(12) United States Patent
Sweeney et al.

(10) Patent No.: US 9,109,755 B2
(45) Date of Patent: Aug. 18, 2015

(54) ENDPOINT DETERMINATION FOR CAPILLARY-ASSISTED FLOW CONTROL

(75) Inventors: Joseph D. Sweeney, Winsted, CT (US); Anthony M. Avila, Austin, TX (US); Michael J. Wodjenski, New Milford, CT (US); Joseph R. Despres, Middletown, CT (US); Thomas H. Baum, New Fairfield, CT (US)

(73) Assignee: ENTEGRIS, INC., Billerica, MA (US)

( * ) Notice: Subject to any disclaimer, the term of this patent is extended or adjusted under 35 U.S.C. 154(b) by 420 days.

(21) Appl. No.: 13/704,612

(22) PCT Filed: Jun. 18, 2011

(86) PCT No.: PCT/US2011/041013
§ 371 (c)(1),
(2), (4) Date: Jan. 23, 2013

(87) PCT Pub. No.: WO2011/160105
PCT Pub. Date: Dec. 22, 2011

(65) Prior Publication Data
US 2013/0125999 A1 May 23, 2013

Related U.S. Application Data

(60) Provisional application No. 61/356,451, filed on Jun. 18, 2010, provisional application No. 61/366,523, filed on Jul. 21, 2010.

(51) Int. Cl.
*F17D 3/00* (2006.01)
*H01L 21/67* (2006.01)

(52) U.S. Cl.
CPC ............ *F17D 3/00* (2013.01); *H01L 21/67017* (2013.01); *H01L 21/67253* (2013.01)

(58) Field of Classification Search
CPC ............... F17D 3/00; F17D 3/01; F17D 3/03; H01L 21/67017; H01L 21/67253
USPC .................................................. 137/2, 624.11
See application file for complete search history.

(56) References Cited

U.S. PATENT DOCUMENTS

| 5,937,895 | A | 8/1999 | Le Febre et al. |
| 6,007,609 | A | 12/1999 | Semerdjian et al. |
| 6,045,115 | A | 4/2000 | Martin, Jr. et al. |
| 6,089,027 | A | 7/2000 | Wang et al. |
| 6,101,816 | A | 8/2000 | Wang et al. |

(Continued)

FOREIGN PATENT DOCUMENTS

| EP | 1890213 A1 | 2/2008 |
| JP | 4-86362 A | 3/1992 |

(Continued)

*Primary Examiner* — Kevin Lee
(74) *Attorney, Agent, or Firm* — Hultquist, PLLC; Steven J. Hultquist; Rosa Yaghmour

(57) ABSTRACT

Apparatus and method for determining endpoint of a fluid supply vessel in which fluid flow is controlled through a flow passage disposed in an interior volume of the fluid supply vessel with a static flow restricting device and a selectively actuatable valve element upon establishing fluid flow. The endpoint determination can be employed to terminate fluid supply from the fluid supply vessel and/or to switch from a fluid-depleted supply vessel to a fresh vessel for continuity or renewal of fluid supply operation. The apparatus and method are suitable for use with fluidutilizing apparatus such as ion implanters.

20 Claims, 4 Drawing Sheets

(56) References Cited

U.S. PATENT DOCUMENTS

| | | |
|---|---|---|
| 6,257,000 B1 | 7/2001 | Wang |
| 6,343,476 B1 | 2/2002 | Wang et al. |
| 6,521,131 B1 * | 2/2003 | Hamilton et al. ............ 210/662 |
| 6,581,623 B1 * | 6/2003 | Carpenter et al. ............ 137/113 |
| 6,955,198 B2 * | 10/2005 | Wodjenski ............ 141/248 |
| 7,114,510 B2 | 10/2006 | Peters et al. |
| 7,708,028 B2 | 5/2010 | Brown et al. |
| 2003/0102051 A1 | 6/2003 | Hasaka et al. |
| 2006/0088948 A1 | 4/2006 | McManus et al. |
| 2007/0257011 A1 * | 11/2007 | Siefering et al. ............ 216/83 |
| 2008/0071425 A1 | 3/2008 | Laverdiere et al. |
| 2008/0110925 A1 | 5/2008 | Hagstrom et al. |
| 2008/0150739 A1 | 6/2008 | Gamard |
| 2009/0050218 A1 | 2/2009 | Burgess et al. |
| 2009/0145494 A1 | 6/2009 | Udischas et al. |
| 2010/0224264 A1 | 9/2010 | Homan et al. |
| 2010/0228399 A1 | 9/2010 | Udischas et al. |
| 2012/0080103 A1 | 4/2012 | Levine et al. |

FOREIGN PATENT DOCUMENTS

| | | |
|---|---|---|
| JP | 9-229798 A | 9/1997 |
| JP | 11-265878 A | 9/1999 |
| JP | 2003-166700 A | 6/2003 |
| KR | 10-2008-0032113 A | 4/2008 |
| WO | 9956057 A1 | 11/1999 |
| WO | 2005093377 A2 | 10/2005 |
| WO | 2014074313 A1 | 5/2014 |

* cited by examiner

US 9,109,755 B2

ENDPOINT DETERMINATION FOR CAPILLARY-ASSISTED FLOW CONTROL

CROSS-REFERENCE TO RELATED APPLICATIONS

This is a national phase under 35 USC 371 of International Patent Application PCT/US 2011/041013 filed Jun. 18, 2011 in the names of Joseph D Sweeney, et al., which in turn claims the benefit of priority under 35 USC 119 of U.S. Provisional Patent Application No. 61/356,451 filed Jun. 18, 2010 and U.S. Provisional Patent Application No. 61/366,523 filed Jul. 21, 2010. The disclosures of International Patent Application PCT/US 2011/041013 and of U.S. Provisional Patent Application No. 61/356,451 and U.S. Provisional Patent Application No. 61/366,523 are hereby incorporated herein by reference in their respective entireties, for all purposes.

FIELD

The present disclosure relates to endpoint determination for capillary-assisted flow control, e.g., in delivery of semiconductor manufacturing fluid from a source of same to a semiconductor manufacturing tool.

DESCRIPTION OF THE RELATED ART

In the use of fluid supply vessels, the supplied fluid may be utilized in apparatus or operations in which continuity of operation is essential to their economic character.

As an example, dopant fluids may be supplied to ion implant tools in semiconductor manufacturing facilities. Any sudden unanticipated exhaustion of the dopant fluid supply during tool operation will force shutdown of the implant tool, and require discarding or rework of wafers then in process, as well as delay in operation as a fresh fluid supply vessel is installed to replace the fluid-depleted vessel.

Such sudden unanticipated exhaustion of the fluid supply and the operational dislocations attending same pose a severe economic disadvantage to the process system. This problem is relevant to the use of fluid supply vessels employing capillary-assisted flow control of the supplied fluid.

SUMMARY

The present disclosure relates to endpoint determination for capillary-assisted flow control.

In one aspect, the disclosure relates to a method of determining an endpoint of a fluid supply process, the method comprising:
selectively establishing fluid flow from a fluid supply vessel;
controlling fluid flow through a flow passage disposed in an interior volume of the fluid supply vessel with a static flow restricting device and a selectively actuatable valve element upon establishing fluid flow; and
monitoring at least one characteristic of the fluid supply vessel or a fluid dispensed therefrom to determine the endpoint,
wherein the static flow restricting device and the selectively actuatable valve element are arranged along the flow passage.

In another aspect, the disclosure relates to an endpoint monitoring and control apparatus for a fluid supply vessel in which fluid flow is controlled through a flow passage disposed in an interior volume of the fluid supply vessel with a static flow restricting device and a selectively actuatable valve element upon establishing fluid flow. The endpoint monitoring and control apparatus comprises a monitoring unit adapted to monitor at least one characteristic of the fluid supply vessel or a fluid supplied therefrom and to generate an output signal, and a CPU operatively linked in output signal receiving relationship to the monitoring unit. The CPU has stored therein endpoint condition information and responsive in receipt of an output signal from the monitoring unit indicative of the endpoint condition to generate a control signal for use in terminating fluid supply from the fluid supply vessel.

An additional aspect of the disclosure relates to a fluid-utilizing apparatus adapted to perform the method of the disclosure as broadly described above.

A still further aspect of the disclosure relates to a method as broadly described above, wherein the method is performed by a fluid-utilizing apparatus.

In another aspect, the disclosure relates to the endpoint monitoring and control apparatus described above, as operationally arranged with at least one fluid supply vessel.

A further aspect of the invention relates to a fluid supply system, comprising a fluid supply vessel having an interior volume for holding fluid, first flow circuitry in the interior volume arranged to control flow of fluid during supply of fluid from the vessel, said first flow circuitry including a static flow restricting device and a selectively actuatable valve element, and a second flow circuitry coupled with the vessel for discharging fluid therefrom, wherein the system comprises at least one of the following elements:
(i) a buffering reservoir in the interior volume of the vessel, coupled with the first flow circuitry, arranged to hold fluid for buffering release thereof to the first flow circuitry;
(ii) a buffering reservoir exterior of the vessel, coupled with the second flow circuitry, arranged to hold fluid for buffering release thereof to the second flow circuitry;
(iii) a pressure regulator arranged to regulate fluid pressure in the second flow circuitry;
(iv) a pressure transducer arranged to monitor fluid pressure in the second flow circuitry; and
(v) a mass flow controller arranged to control mass flow of fluid in the second flow circuitry, wherein when any one or more of elements (ii)-(v) is comprised in said system, the system may further optionally comprise a CPU programmably arranged to receive at least one monitoring signal from a device monitoring at least one characteristic of the fluid supply vessel or a fluid dispensed therefrom, to determine an endpoint of fluid supply from the fluid supply vessel.

Other aspects, features and embodiments of the invention will be more fully apparent from the ensuing disclosure and appended claims.

DETAILED DESCRIPTION

Figure 1:
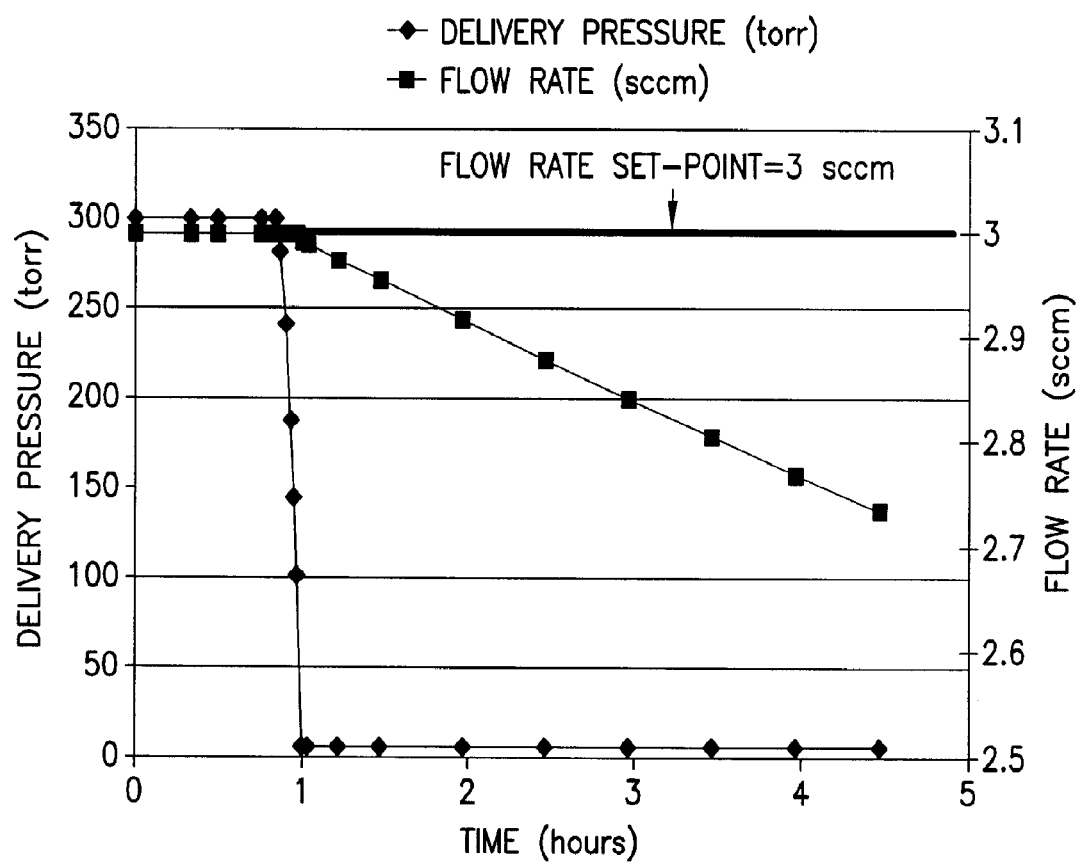
FIG. 1 is a graph of delivery pressure, in torr, and flow rate, in sccm, each as a function of time, in hours, for a simulated fluid supply vessel holding boron trifluoride gas, with a capillary restriction device in the interior volume of the supply vessel, upstream of a vacuum actuated valve in such interior volume, with the supply vessel having a valve head coupled to its neck portion, for opening or closing of a valve element in such valve head, to enable flow of fluid or to terminate flow of fluid, respectively.

The present disclosure relates to endpoint determination for capillary-assisted flow control, such as may be used for supplying fluid to a semiconductor manufacturing tool such as an ion implanter.

The endpoint determination may be carried out in a method including: selectively establishing fluid flow from a fluid supply vessel; controlling fluid flow through a flow passage disposed in an interior volume of the fluid supply vessel with a static flow restricting device, e.g., a capillary device, and a selectively actuatable valve element upon establishing fluid flow; and monitoring a characteristic of the fluid supply vessel or a fluid supplied therefrom to determine the endpoint, wherein the static flow restricting device and the selectively actuatable valve element are arranged along the flow passage.

The static flow restricting device may comprise one or more capillary type or flow throttling passages. For example, the flow restricting device can include two or more capillary type or flow throttling passages arranged in parallel along a portion of the flow passage.

The static flow restricting device can be positioned in the interior volume of the supply vessel in any suitable manner and/or configuration. The static flow restricting device can for instance be positioned before or after the selectively actuatable valve element on the flow passage. In one illustrative arrangement, the static flow restricting device is positioned between the selectively actuatable valve element and an inlet of the flow passage. In another illustrative arrangement, the selectively actuatable valve element is positioned between the static flow restricting device and an inlet of the flow passage.

The selectively actuatable valve element can be of any suitable type. For example, the selectively actuatable valve element can comprise a vacuum actuated valve. In one specific embodiment, the selectively actuatable valve element comprises a poppet type valve.

The fluid contained in and supplied from the fluid supply vessel can be of any suitable type. For example, the fluid can comprise a fluid having utility in semiconductor manufacturing operations, such as chemical vapor deposition, etching operations, atomic layer deposition, lithography operations, and ion implantation. More specifically, the fluid can comprise a fluid species selected from the group consisting of arsine, phosphine, boron trifluoride, boron trichloride, diboron tetrafluoride, diborane, hydrogen selenide, xenon difluoride, silane, polyalkylsilanes, organometallic reagents, fluorine (F2), hydrogen sulfide (H2S), germane (GeH4), and hydrido and alkylhydrido species of Si, Ge, Sn and Sb.

In the endpoint determination method, a characteristic of the fluid supply vessel or a fluid supplied therefrom is monitored to determine the endpoint. Such monitoring may be conducted in any suitable manner. In various embodiments, the monitoring includes comparing the monitored characteristic to a reference characteristic to determine the endpoint.

The monitored characteristic itself can be of any useful type and can for example include physical characteristics, temporal characteristics, hydrodynamic conditions, or any other qualities, quantities, features or states. The monitored characteristic in specific implementations of the endpoint determination may include one or more appropriate monitoring variables, such as fluid flow duration, fluid flow rate, fluid pressure, fluid temperature, supply vessel temperature, supply vessel weight, concentration of a component of the supplied fluid, etc.

For example, the endpoint can be determined to have been reached when: a) a predetermined fluid flow rate has been detected; b) a predetermined fluid pressure has been detected; c) a predetermined fluid flow duration has been detected; d) a predetermined amount of fluid has been supplied; e) a predetermined change in fluid pressure has been detected; f) a predetermined change in fluid flow rate has been detected; and/or g) a predetermined weight or change of weight of the supply vessel and its contents has been detected.

In instances in which the fluid supply is arranged to determine endpoint when a predetermined fluid flow rate has been detected, the endpoint fluid flow rate in a specific embodiment may be within a range of from 0.1 to 5 standard cubic centimeters per minute (sccm). The user may configure the fluid supply monitoring arrangement to determine endpoint at a value that is a predetermined percentage of the desired flow rate setpoint for normal dispensing operation of the supply vessel, or that is in a specified ratio to such desired flow rate setpoint for normal dispensing operation.

In applications in which the fluid supply is arranged to determine endpoint when a predetermined fluid pressure has been detected, the endpoint condition can be any suitable pressure level, e.g., a pressure value in a range of from 0 to 760 ton, or a pressure in a range of from 2 to 400 ton, or any other suitable value of pressure of the fluid supplied from the vessel.

In applications in which the fluid supply is arranged to determine endpoint when a predetermined fluid flow duration has been detected, the endpoint duration can be defined by the average user flow rate and vessel inventory. For example, a supply vessel containing 300 grams of boron trifluoride, supplying $BF_3$ gas at an average flow rate of 3 sccm, could theoretically supply gas for about 549 hours, assuming delivery of 100% of the gas inventory in the vessel. In this case, the user might select the endpoint to be 75%, 80%, 85%, or an even higher percentage of this value. In a specific embodiment, such endpoint value might be selected to be 80%, or 440 hrs, at which time the user might receive an alarm or message indicating that the supply vessel is near empty. The actual percentage that the user selects is likely to be dependent on the user's knowledge of the supply vessel heel (heel being the amount of residual fluid remaining in the vessel at the conclusion of discharge of fluid from the vessel, when run to a point at which the pressure of fluid from the vessel is no longer adequate to overcome pressure drop in the flow circuitry interconnecting the vessel with a fluid-utilizing apparatus or location, so that flow stops), or otherwise based on prior experience with the duration of fluid discharged until endpoint conditions are achieved. Alternatively, the duration endpoint can be established empirically, by charging the supply vessel with fluid to a predetermined extent, and then logging the duration of the fluid discharge at various rates of discharge, to establish a reference database of endpoint conditions that can be programmatically employed to set endpoint alarm conditions.

In applications in which the fluid supply is arranged to determine endpoint when a predetermined cumulative weight of fluid is discharged from the supply vessel, the predetermined endpoint value can be selected based on knowledge of the supply vessel heel or prior experience with supply vessels of the same character, or otherwise empirically. By way of example, for a supply vessel containing 335 grams of fluid to be selectively discharged for use, the heel might be about 44 grams (for a 3 sccm flow rate), and the endpoint might be chosen as being a cumulative weight value in a range of 250-300 grams of discharged fluid. This cumulative value will depend on the fill level of the vessel when furnished for fluid supply service as a "fresh" vessel, and can be readily established for varied levels of fill of the fluid in the supply vessel. Measurement and monitoring of the weight of fluid discharged from the supply vessel can be carried out by continuous measurement of the supply vessel weight, from the initial full state as discharge of fluid proceeds, or by monitoring vessel weight continuously after some point in the service life of the vessel, when intermittently taken weight data indicates a suitable point as having been reached, e.g., at 80% of initial fluid inventory as having been discharged from the vessel.

Other techniques for monitoring the weight of the fluid discharged from the supply vessel to establish an endpoint condition can include use of a mass flow controller in order to totalize the flow of the discharged fluid over time, and computationally using the totalized value with the molecular weight of the discharged fluid to determine the weight of the fluid that has been released from the supply vessel.

In applications in which the endpoint is determined to have been reached when a predetermined change in fluid pressure has been detected, the endpoint can be established as a specific percentage or fraction of the delivery pressure. For example, using a supply vessel having a delivery pressure of from 200 to 400 torr, an endpoint value in specific embodiments may be 10%, 20%, 30%, 50% or more of such delivery pressure.

In applications in which the endpoint is determined to have been reached when a predetermined change in fluid flow rate has been detected, the variation from a set point fluid discharge rate from the supply vessel can be employed as the endpoint marker, at a selected value. This variation can depend on the specific fluid-utilization apparatus or location of use of the fluid discharged from the supply vessel. In a specific embodiment, the variation indicative of the endpoint being reached can be any suitable value, e.g., a fluid flow rate change of 1%, 3%, 5%, 10%, etc.

In applications in which the endpoint is determined to have been reached when a predetermined weight or change of weight of the fluid supply vessel has occurred, the weight of the vessel can be monitored during the discharge of fluid for use, or during a relevant portion of such discharge, to determine when the endpoint condition has been reached.

In various embodiments in which the fluid supply vessel is used to provide fluid to an ion implanter in a semiconductor manufacturing facility, endpoint may be determined by monitoring implanter beam current or ion source arc current in the implanter to detect a drop in such current levels, as being indicative of the fluid supply vessel approaching an empty state. In order to improve the accuracy and reliability of the monitoring operation, such current monitoring operation may be combined with one or more of the monitoring techniques described in the preceding discussion.

More generally, any of the aforementioned techniques or monitoring modalities can be employed in combination with one or more others, to provide a combinatorial monitoring system to provide redundancy of monitoring capability, or to provide multiple inputs to a monitoring system, to enhance accuracy and reliability of such monitoring. For example, an endpoint monitoring and control system may be provided, enabling a user to select a desired type or types of endpoint monitoring capability from among multiple provided modalities. Thus, a user may select a percentage drop in delivery pressure of supplied fluid as the monitored variable for endpoint determination, and select an actual value to be employed as the endpoint determinant, e.g., a 20% drop in delivery pressure. The user may additionally, or alternatively select multiple variables for monitoring, e.g., percentage drop in fluid delivery pressure of fluid discharged from the vessel and total number of grams of fluid discharged from the vessel.

The aforementioned monitored variables for endpoint determination may be detected by any suitable sensors, detectors, or monitors that are appropriate to such purpose. The monitoring apparatus may be arranged to provide an output signal that is indicative or correlative of the monitored condition or state of interest, with the output signal of such monitoring apparatus being transmitted by suitable signal transmission lines to a central processor unit (CPU) for processing of such monitoring signal and responsive generation of an output control signal indicative of the endpoint that may be used to actuate an endpoint alarm and/or apparatus that effects shutdown or isolation of the fluid-depleted supply vessel, so that it is taken off line for replacement with a fresh supply vessel, for continued or renewed operation involving fluid supply. The apparatus actuated by such output control signal can in specific embodiments be flow control valves or valve actuators, power supplies, pumps, compressors, purge apparatus, or any other suitable apparatus that is controlled or controllable by the output signal. The CPU employed in such monitoring and control systems can be of any suitable type, including for example special purpose programmed or programmable computers, microprocessors, programmable logic controllers, etc.

In specific illustrative embodiments of the monitoring methodology of the present disclosure, the endpoint condition may be selected so that at such condition, a specified amount of the original fluid inventory of the fluid supply vessel is present in the interior volume of the vessel, e.g., an amount in a range of from 1 to 20% of the original fluid inventory, such as 1%, 2%, 5%, 8%, 10%, 12%, 15% or 20%, or other value or value in other ranges.

When pressure is used as a monitored variable for endpoint monitoring purposes, the pressure can be monitored in any suitable manner, e.g., by monitoring pressure drop across the static flow restricting device that is disposed in the interior volume of the supply vessel, and/or by monitoring pressure drop across a static flow restricting device in the fluid flow circuitry coupled with the fluid supply vessel to deliver fluid to the point of use, such as a restricted flow orifice (RFO), an inline gas snubber device, or other suitable device in or coupled with the flow circuitry.

While the foregoing is directed primarily to ion implantation applications, in respect of specific parameters and ranges applicable to endpoint values, those skilled in the art can readily empirically determine appropriate settings and operational parameters, based on the present disclosure, applicable to other applications.

The static flow restricting device that is disposed in the interior volume of the supply vessel can be of any appropriate type, and can for example comprise one or more capillary tubes, through which fluid is flowed for ultimate discharge from the fluid supply vessel. As previously discussed herein, the static flow restricting device in the interior volume of the supply vessel is employed to control fluid flow through a flow passage in such interior volume, in conjunction with a selectively actuatable valve element upon establishing fluid flow. In one embodiment, the static flow restricting device comprises two or more capillary type or flow throttling passages arranged in parallel along a portion of the flow passage.

Concerning pressure drop across a capillary tube, in a given capillary type flow restricting device, the design of such device, including the number, length and diameter of capillary tubes, the fluid flow rate of the fluid discharged from the supply vessel, the temperature and the supply vessel pressure at any specific moment in time, will all effect the pressure drop. The pressure drop associated with endpoint status of the fluid supply vessel may be mathematically determined as hereinafter described, to specify a particular pressure drop that is associated with a specific fractional or percentage loss of delivery pressure, or loss of a specific fractional or percentage amount of the set point or otherwise desired flow rate of the fluid discharged from the supply vessel for use.

The capillary type flow restricting device in various embodiments may be positioned upstream of a regulator, vacuum actuated check valve, or other flow modulating device in the interior volume of the fluid supply vessel.

The endpoint profile of a capillary and regulator system can be modeled to show the pressure and flow profile. The present applicants have experimentally confirmed these results by building a capillary and regulator system. At the end point of the gas supply vessel, the pressure drop that is associated with frictional losses is significant and therefore the density can no longer be assumed to be constant. This results in having compressible fluid flow. In this case the following equation (1) can be used to estimate flow.

More specifically, the mathematical determination of pressure drop of a capillary tube may comprise determination based on a pressure drop equation (1), as set out below:

$$p_1^2 - p_2^2 = G^2 \frac{RT}{M_w}\left[\frac{4fL}{D} + 2\ln\left(\frac{p_1}{p_2}\right)\right] \quad (1)$$

wherein the equation variables are as defined below:
$p_1$=conduit inlet pressure
$p_2$=conduit outlet pressure
G=mass flux of gas
R=universal gas constant
T=gas temperature
$M_w$=gas molecular weight
f=friction factor=16/RE (laminar flow)
RE=Reynolds number=GD/µ
µ=gas viscosity
L=conduit length
D=conduit diameter FIG. 1 is a graph of delivery pressure, in ton, and flow rate, in sccm, each as a function of time, in hours, for a simulated fluid supply vessel holding boron trifluoride gas, with a capillary restriction device in the interior volume of the supply vessel, upstream of a vacuum actuated valve in such interior volume, with the supply vessel having a valve head coupled to its neck portion, for opening or closing of a valve element in such valve head, to enable flow of fluid or to terminate flow of fluid, respectively. The valve head may be arranged for manual or automatic operation of the valve element in the valve head, such as by a hand wheel for manual operation, or a pneumatic valve actuator for automatic operation, or in some other arrangement enabling translation of the valve element in the valve head, between fully opened and fully closed positions.

In the simulated fluid supply vessel for which the FIG. 1 graph was generated, the capillary restriction device comprises an array of seven capillary tubes, each 2.8 inches in length and 20 µm in internal diameter. The fluid flow rate for the boron trifluoride gas is 3 sccm.

At time zero on the FIG. 1 graph, the supply vessel has been in operation, discharging fluid for downstream utilization, for a number of hours in steady-state fluid supply operation. The delivery pressure shown in the graph is the pressure of the fluid when it is discharged from the vessel. The pressure $p_2$ in equation (1) is the pressure immediately downstream of the capillary flow restrictor. When pressure $p_2$ declines to the supply vessel delivery pressure set point, denoted here as $p_3$, the two pressures thereafter will be substantially equal to one another for the remainder of the fluid supply service life of the fluid supply vessel in steady-state fluid discharge operation. The following is a description of fluid discharging operation of such fluid supply vessel.

In fluid discharging operation, fluid is discharged from the supply vessel for number of hours, depending on the initially provided fluid inventory (fill quantity) and flow rate set point. As fluid is progressively discharged from the supply vessel, the vessel pressure, $p_1$, is dropping. For a given flow rate of fluid, as well as a given temperature and capillary restrictor design, the right-hand side of equation (1) is substantially constant for all $p_1$ and $p_2$ values, the Ln term being very small in relation to the 4 fL/D term of the equation. As a result, the left-hand side term must remain substantially constant for any given fluid flow rate G.

Thus, $p_1\hat{0}2 - p_2\hat{0}2 = C$ (constant), or, algebraically, $(p_1\hat{0}2 - p_2\hat{0}2) = (p_1 + p_2)^*(p_1 - p_2) = C$. As $p_1$ declines, $p_2$ also declines, but in order to ensure that the equation is satisfied, i.e., that $(p_1 + p_2)^*(p_1 - p_2) = C$, the term $(p_1 - p_2)$ must increase. In consequence, $p_2$ must decline more rapidly than $p_1$. Accordingly, delivery pressure in supply vessels having capillary type flow restrictors therein will drop rapidly as delivery pressure approaches zero, and there is relatively short time to respond. Differentiation of the pressure drop expression shows that $p_2$ changes with respect to $p_1$ in the following way:

$$dp_2/dp_1 = p_1/p_2$$

so that as $p_2$ gets small and eventually is equal to and then less than the set point of the internal flow control device, e.g., regulator or vacuum actuated check valve, the change in $p_2$ with respect to $p_1$ becomes larger and larger. In other words, the drop in delivery pressure accelerates with a drop in supply vessel pressure. This results in the delivery pressure of the discharge fluid changing from a desired dispensing pressure level to a value very close to zero in a very short period of time.

Once the delivery pressure drops to a particular low value, e.g., 3-10 torr, or other low pressure that is just adequate to drive the flow of discharged fluid through the discharge flow circuitry, the flow rate of discharged fluid will gradually start to fall, as the supply vessel pressure is dropping with depletion of gas therefrom. Now the flow rate G will start to drop in accordance with equation (1) above, but with $p_2$ approximately constant ($p_2$ will drop very slightly with flow, as a lower flow requires a lower pressure to drive the fluid through the discharge flow circuitry. The flow then continues to drop until the user of the fluid supply vessel notices, or until the downstream fluid-utilizing apparatus shuts down and/or alarms by action of an interlock assembly. For example, when the downstream fluid-utilizing apparatus is an ion implanter receiving dopant source gas from the fluid supply vessel, the interlock mechanism may be actuated by specific loss of flow rate or beam current.

The fluid supply vessel monitoring methods and systems of the present disclosure enable such extremely rapid transition from fluid discharging operation to exhaustion of the supply vessel to be avoided, by endpoint determination, and controlled cessation of discharge operation as a result of one or more monitored variables affecting and/or affected by the fluid discharge operation. The monitoring may as previously described be associated with a CPU and/or other control device(s) that may have stored in a memory or memory element of the CPU a fluid discharge operational profile for the monitored variable(s), as a baseline profile from which actual monitoring data can be assessed for deviations that indicate onset or achievement of a predetermined fluid-depleted state of the fluid supply vessel, and thus trigger end point actuation or de-actuation of control devices to terminate discharge of fluid from the fluid supply vessel. The CPU thus may be programmatically arranged for such monitoring, and to output one or more control signals to effect end point operational changes to shut down or isolate the fluid supply vessel, and/or to effect change over to a fresh fluid supply vessel containing the fluid for further operation of the fluid-utilizing apparatus or locus.

Thus the present disclosure contemplates, in one aspect, an endpoint monitoring and control apparatus for a fluid supply vessel in which fluid flow is controlled through a flow passage disposed in an interior volume of the fluid supply vessel with a static flow restricting device and a selectively actuatable valve element upon establishing fluid flow. Such endpoint monitoring and control apparatus comprises a monitoring unit adapted to monitor at least one characteristic of the fluid supply vessel or a fluid supplied therefrom and to generate an output signal, and a CPU operatively linked in output signal receiving relationship to the monitoring unit, said CPU having stored therein endpoint condition information and responsive in receipt of an output signal from the monitoring unit indicative of the endpoint condition to generate a control signal for use in terminating fluid supply from the fluid supply vessel.

The endpoint monitoring and control apparatus may further comprise a control device operatively linked in control signal receiving relationship to the CPU and responsive in receipt of the control signal to operate and terminate or assisting to terminate fluid supply from the fluid supply vessel. Such endpoint monitoring and control apparatus thus may be operationally arranged with at least one fluid supply vessel, for monitoring and control of the operation of such fluid supply vessel or an array of multiple fluid supply vessels. In a specific embodiment, the endpoint condition information stored in the CPU may comprise at least one fluid discharge operational profile for a monitored characteristic of the fluid supply vessel, as a baseline profile from which actual monitoring data can be computationally assessed by the CPU for deviations that indicate onset or achievement of a predetermined fluid-depleted state of the fluid supply vessel.

As another variation of the fluid supply arrangements that may be employed within the broad scope of the disclosure hereof, the fluid supply vessel and/or downstream flow circuitry may be arranged with one or more buffer volumes for accumulation of fluid to be discharged to the fluid-utilizing apparatus or locus, so that one or more reservoirs of such fluid is provided to enable continued dispensing of fluid at desired set point conditions, beyond what would be possible in the absence of such reservoir(s). The fluid supply system including such reservoir(s), as buffer zones within or outside of the supply vessel, can thereby extend the operational lifetime of the fluid supply vessel, and can be arranged so that such additional supply of fluid continues beyond the endpoint that would otherwise trigger shutdown or switch over to her fresh vessel, so that transitional time is afforded for the operational changes incident to endpoint arrival of the fluid supply vessel.

The static flow restricting device in the interior volume of the fluid supply vessel, as mentioned, can be of any suitable type. In one embodiment, the flow restricting device can comprise a restricted flow orifice (RFO), and such RFO can be positioned in the discharge path of fluid in the interior volume of the vessel, upstream or downstream of an interior flow-modulating device such as a regulator or vacuum actuated dispensing check valve. For example, the fluid supply vessel may include multiple RFO devices and/or multiple regulators, in embodiments including RFO and regulator components for flow control of the fluid that is discharged from the vessel in use.

In another aspect, the endpoint of the fluid supply vessel in operation can be determined, and/or fluid inventory of the fluid supply vessel can be monitored, by measuring a change in a property or properties of the fluid supply vessel or a component thereof. Suitable properties for such application include, without limitation, acoustic, thermal, resistive and/or pressure chromic properties. In various applications, materials can be integrated in the fluid supply vessel wall or a component of the vessel, which are useful for sensing/measuring one or more properties of the vessel.

For example, the wall of the fluid supply vessel may be thermally probed at vertically spaced-apart locations and the resulting thermal response measured, e.g., in applications in which a liquid inventory is maintained in the interior volume of the fluid supply vessel. Since a predetermined heat input at a portion of the wall bounded by gas in the vessel interior will be dissipated very differently that wall portions that is in internal contact with liquid, heat above a liquid interface will be dissipated more slowly (because gas is a poor conductor), while the same input at the wall below the liquid interface will dissipate much more rapidly due to the thermal conductivity of the liquid.

The monitoring will thus move down the wall is liquid inventory is exhausted, and the liquid interface can be tracked quite closely at any given point in time during the gas discharging operation.

In another arrangement, one sensor is located on the exterior wall of the fluid supply vessel, at a level corresponding to a desired heels for change-out. The fluid supply vessel monitoring and control system is arranged to monitor repetitive heat inputs (periodic inputting of heat) at that input site, and when liquid is depleted to place the wall on the other side of the thermal input/monitoring locus in contact with gas, the monitoring signal will change to reflect gas rather than liquid at that site. The signal can trigger (through an optical cable, or other signal transition modality) a change out operation, to minimize down-time of the tool. Rather than a thermal challenge (input) for the monitoring, any other external wall input and monitoring capability could be used, such as acoustic, vibratory, ultrasound, or other input, where the input can propagate to/through the fluid supply vessel wall, and produce a differential response depending on whether gas or liquid is contacting the interior surface of the vessel at the signal input/monitoring site.

The present disclosure contemplates a fluid-utilizing apparatus that is adapted to perform the broad method of the invention, as well as a method of such type, wherein the method is performed by a fluid-utilizing apparatus.

Figure 2:
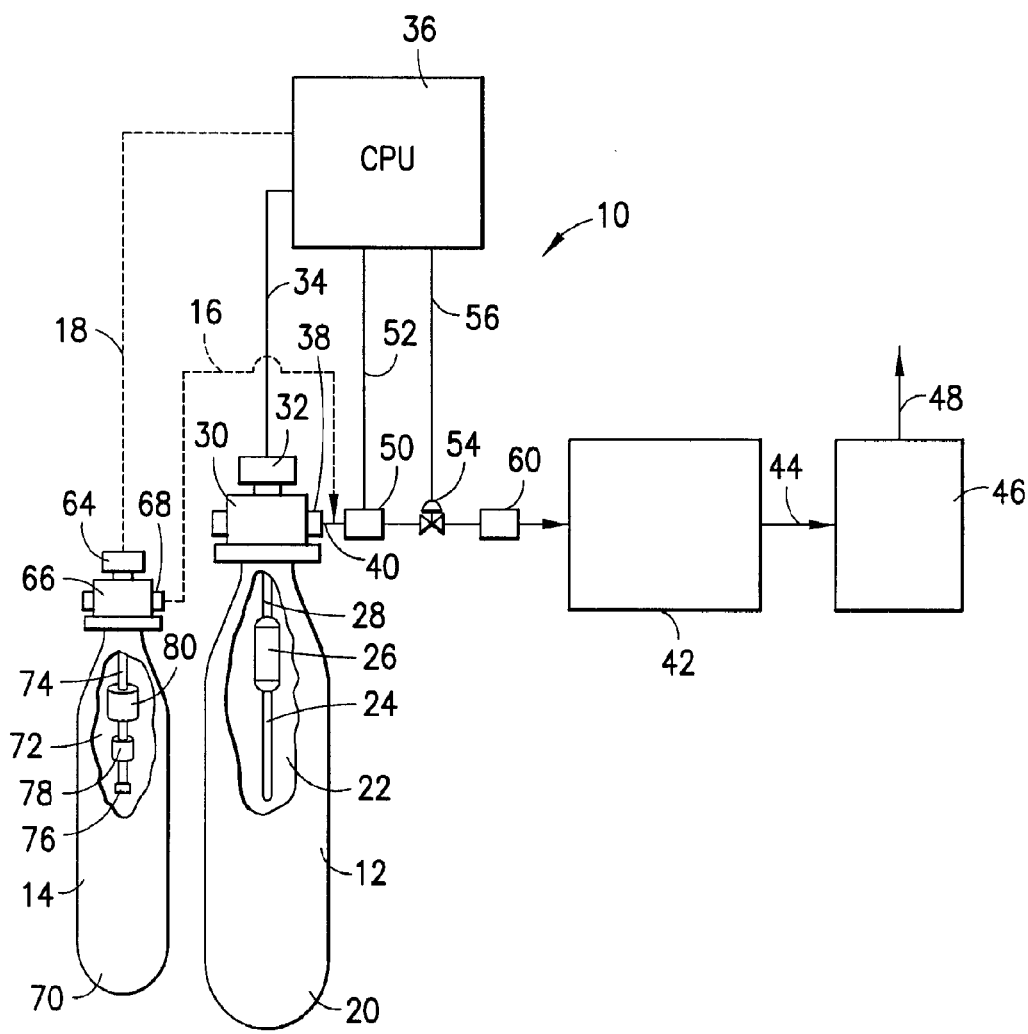
FIG. 2 is a schematic representation of an illustrative fluid supply and utilization system in which the monitoring and control arrangements of the present disclosure may be advantageously implemented for endpoint determination and operational management of fluid supply vessels.

FIG. 2 is a schematic representation of an illustrative fluid supply and utilization system 10 in which the monitoring and control arrangements of the present disclosure may be advantageously implemented for endpoint determination and operational management of fluid supply vessels, such as the vessels 12 and 14 shown in the drawing.

In FIG. 2, the fluid supply vessel 12 is shown as the onstream vessel, and fluid supply vessel 14 is shown as being off stream, such off stream status being indicated by the dashed line representation of respective fluid supply and control signal transmission lines 16 and 18. The onstream vessel 12 as illustrated includes a casing or shell 20 enclosing an interior volume 22, in which is disposed a static flow restricting device 24, e.g., comprising an array of capillary tubes arranged in parallel to one another, through which fluid from the interior volume 22 can flow along a flow path including the static flow restricting device 24, flow modulating device 26, e.g., a vacuum actuated dispensing check valve, and discharge conduit 28. The discharge conduit 28 delivers fluid to valve head 30 containing a valve element that is translatable between fully open and fully closed valve positions by the automatic valve actuator 32, which is operated by control signals transmitted in signal transmission line 34 to such actuator from the CPU 36.

The valve head 30 of the vessel 12 includes a discharge port coupled to fluid discharge line 40 through which fluid is flowed to the downstream fluid utilizing facility 42, which may for example comprise an ion implanter of a semiconductor manufacturing facility. In the fluid utilizing facility, the fluid supplied from fluid discharge line 40 is utilized, and in the specific embodiment shown, the fluid utilization operation in facility 42 produces an effluent that is discharged in effluent discharge line 44. The discharged effluent flows in discharge line 44 two effluent treatment unit 46, from which treated effluent is discharged in vent line 48.

In the discharge line 42 which fluid is supplied from the fluid supply vessel 12, a discharge fluid monitoring unit 50 is disposed, to monitor an endpoint-determinative characteristic of the discharged gas flowing therethrough. The discharge fluid monitoring unit 50 is constructed and arranged to generate an output signal that is correlative of the characteristic being monitored, and such output signal is transmitted in signal transmission line 52 to the CPU 36 for processing. Also disposed in discharge line 40 is a flow control valve 54 coupled in controlled relationship by control signal transmission line 56 to CPU 36, and in the specific illustrated embodiment, a further flow control device 60. The further flow control device 60 can be of any suitable type, and may for example comprise a mass flow controller, pressure regulator, or other appropriate device. Such further flow control device may additionally be coupled with CPU 36 (connection not shown in FIG. 2).

The fluid monitoring unit 50 may be arranged to monitor pressure of the discharged fluid flowing through discharge line 40, and to transmit a pressure-correlative output signal to the CPU 36. In lieu of such pressure monitoring, the monitoring unit 50 may monitor any other suitable characteristic of the dispensed fluid, such as temperature, flow rate, concentration of a gas species in a multicomponent gas mixture when the dispensed fluid comprises for example a carrier gas and an active gas, or any other arrangement in which the monitoring unit 50 is specifically adapted for such specific monitoring application. The monitored characteristic may therefore be detected intermittently or continuously, or a combination thereof, to identify conditions indicative of onset of exhaustion of the fluid supply vessel, and transmit an output signal to the CPU to effectuate corresponding transition of the fluid supply and utilization system.

In the FIG. 2 arrangement, when the endpoint-associated condition is detected by the monitoring unit 50, the corresponding signal transmitted to the CPU 36 in signal transmission line 52 is processed by the CPU and an output produced. Such output comprises a control signal in the FIG. 2 embodiment, with a signal being transmitted in signal transmission line 34 to actuator 32 to close the valve and valve head 30, and concurrently a control signal is transmitted in signal transmission line 56 to flow control valve 54, to shut such valve, so that the exhausted vessel 12 can be taken off-line. In connection with such transition, the fluid supply vessel 14 may be switched into operation, with transmission of the control signal in signal transmission line 18 to valve actuator 64 arranged to control the valve in valve head 66, so that fluid from fluid supply vessel 14 is flowed from a discharge port 68 of the valve head 66 through fluid discharge lines 16 to fluid discharge line 40 (vessel 12 being uncoupled from discharge line 40 at such point), for continuity or renewal of fluid flow to the fluid utilizing facility 42.

The fluid supply vessel 14 as shown includes a casing or shell 70 enclosing an interior volume of 72 of the vessel. In the interior volume 72 is disposed a discharge conduit 74 containing a filter 76, a restricted flow orifice 78 and a flow control device 80 therein. The flow control device 80 may comprise a pressure regulator, a vacuum actuated dispensing check valve, or any other suitable flow control device useful for modulating flow of fluid dispensed from the vessel.

Although not shown for reasons of simplicity, the respective vessels 12 and 14 can be integrated into a valve manifold arrangement to facilitate switching and changeover of operation, from a depleted vessel to a fresh vessel, wherein valving in the manifold is suitably arranged to enable change out of depleted vessels, while maintaining continuity of operation. Such valving may therefore be operatively controlled by a CPU such as CPU 36 shown in the schematic drawing in FIG. 2, or in other appropriate manner.

It will be recognized that the fluid supply and utilization system may be variously configured, within the skill of the art, based on the disclosure herein, to encompass other aspects, features and embodiments. For example, instead of the two fluid supply vessels 12 and 14, more than two vessels can be employed, or only a single vessel may be employed in the system. The monitoring and control elements and their arrangement may be widely varied, to provide active tracking of the fluid dispensing operation, with respect to determination of endpoint, and responsive action to manage the fluid utilizing operation being carried out.

Figure 3:
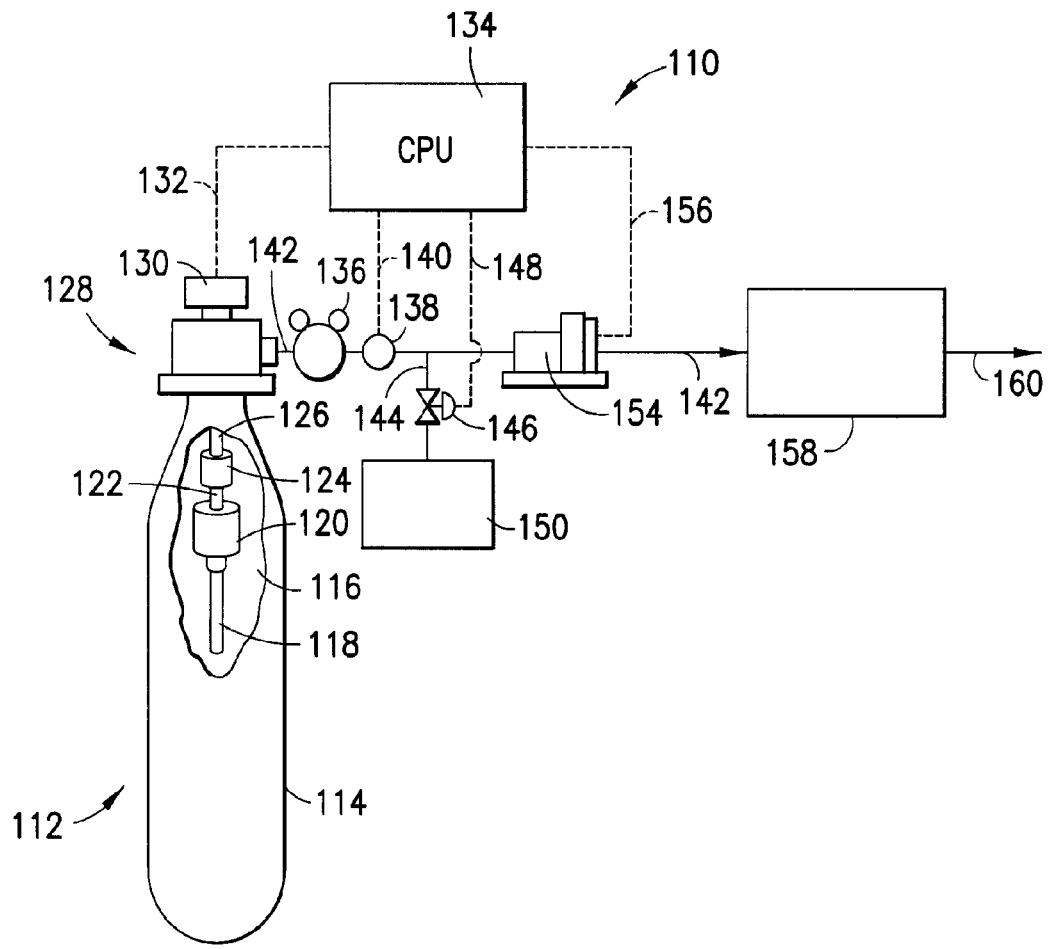
FIG. 3 is a schematic representation of a fluid supply and utilization system according to another implementation in which the end point determination can be made using proportional-integral-derivative (PID) output of a mass flow controller, with augmentation of the fluid supply by buffering reservoirs to accommodate sudden onset pressure diminution at the endpoint condition.

FIG. 3 is a schematic representation of a fluid supply and utilization system 110 according to another implementation, in which the end point determination can be made using proportional-integral-derivative (PID) output of a mass flow controller, with augmentation of the fluid supply by buffering reservoirs to accommodate sudden onset pressure diminution at the endpoint condition.

As illustrated in FIG. 3, the fluid supply and utilization system 110 includes a fluid supply vessel 112 including a cylindrical vessel casing 114 enclosing an interior volume 116 of the vessel. In the interior volume is disposed a static flow restricting device 118, e.g., including an array of capillary tubes arranged in parallel to one another, through which fluid from the interior volume 116 can flow along a flow path including static flow restricting device 118, auxiliary fluid reservoir 120, flow conduit 122, flow modulating device 124, e.g., a selectively actuatable valve element such as a vacuum actuated dispensing check valve, and discharge conduit 126. The discharge conduit 126 delivers fluid to valve head 128 containing a valve element that is translatable between fully open and fully closed valve positions by the automatic valve actuator 130, which is operated by control signals transmitted in signal transmission line 132 to such actuator from the CPU 134.

The valve head 128 of the vessel 112 includes a discharge port coupled to fluid discharge line 142 through which fluid is flowed to the downstream fluid-utilizing facility 158, which may for example comprise an ion implanter, or a vapor deposition chamber, e.g., a chemical vapor deposition chamber or an atomic layer deposition chamber, of a semiconductor manufacturing facility.

In the fluid utilizing facility, the fluid supplied from fluid discharge line 142 is utilized, and in the specific embodiment shown, the fluid utilization operation in facility 158 produces an effluent that is discharged in effluent discharge line 160, and may be passed to an abatement facility (not shown) for abatement of the contaminants therein.

A fluid pressure regulator 136 can be provided in discharge line 142 to control the pressure of the fluid supplied by the fluid supply vessel. Discharge line 142 also contains a pressure transducer 138 joined in signal transmission relationship via signal transmission line 140 to the central processor unit (CPU) 134. Further contained in discharge line 142 is a mass flow controller 154 joined in signal transmission relationship via signal transmission line 156 to CPU 134.

The fluid supply and utilization system shown in FIG. 3 employs buffer reservoirs 120 and 150 to provide additional fluid supply capability to accommodate endpoint conditions that would otherwise involve a sudden onset drop in delivery pressure of the fluid being supplied, in the absence of such buffer reservoirs.

The buffer reservoirs in the FIG. 3 system include auxiliary fluid buffer reservoir 120 disposed in the interior volume 116 of vessel 112, between the capillary flow control device 118 and conduit 122. The buffer reservoir 120 thereby provides an additional volume of fluid for dispensing when the vessel is otherwise in an endpoint condition in its operation. The buffer reservoir 120 may be formed of a metal or other suitable material or fabrication, and provides sufficient volume for buffering of the flow of fluid from the vessel, in order to smooth the rapid change (decrease) in fluid flow at the endpoint condition.

In addition to such internal buffering reservoir, the FIG. 3 system includes an external buffering reservoir 150, coupled with the discharge line 142 by flow line 144 containing flow control valve 146. The flow control valve 146 is joined in signal-receiving relationship with CPU 134 via signal transmission line 148, whereby CPU 134 can transmit a control signal in signal transmission line 148 to the flow control valve 146 for opening of same at the endpoint condition, to provide additional fluid supply and thereby extend operating time to permit changeover or change-out of the depleted fluid supply vessel, so that it is removed from service.

As shown, the CPU 134 is joined by respective signal transmission lines 132, 140, 148 and 156, to valve head valve controller 130, pressure transducer 140, flow control valve 146 and mass flow controller 154, so that the CPU receives signals from pressure transducer 138 in signal transmission line 140 and signals from mass flow controller 154 in signal transmission line 156. The CPU may be programmably arranged to utilize such signals to produce outputs that are transmitted in signal transmission lines 132 and/or 148, to modulate the valve controller 130 and/or flow control valve 146, to control the flow of fluid being passed to fluid-utilizing facility 158 in discharge line 142.

It will be recognized that pressure regulator 136, pressure transducer 138 and mass flow controller 154 may be used singly as well as in combination with one or more of such elements, as may be desirable in a given application of the fluid supply and utilization system.

Thus, the FIG. 3 system could be utilized with only pressure regulator 136, with only pressure transducer 138, or with only mass flow controller 154, in various embodiments, and two or more of such elements may be used in other embodiments of such system as compositely shown in FIG. 3.

In one embodiment of the generalized system shown in FIG. 3, the output signal from mass flow controller 154 transmitted to CPU 134 in signal transmission line 156 includes a proportional-integral-derivative (PID) signal from the mass flow controller, with such PID signal being processed by the CPU to determine endpoint condition of the fluid supply vessel 112.

In this respect, the delivery pressure of fluid supplied from vessel 112 will rapidly change at an "inflection point" of the delivery pressure vs. time curve. Such inflection point change can be detected by monitoring the PID output of mass flow controller 154, and utilized to determine an endpoint condition of the fluid supply vessel, and initiate responsive action, such as terminating flow of the on-stream vessel and switching the process system over to a fresh vessel, or actuating the supply of fluid from buffer reservoir(s) of fluid to extend operation prior to termination and/or switchover from the depleted vessel to a fresh vessel. The CPU therefore may be arranged for monitoring, utilizing such PID output signal from the mass flow controller to responsively modulate the fluid supply system.

In this respect, it is noted that the PID output monitoring of the mass flow controller may be utilized to supply fluid from fluid supply vessels operated under constant flow delivery conditions, as well as with supply vessels operated in accordance with various duty cycles, in which fluid supply vessels are utilized to intermittently deliver fluid to a fluid-utilizing facility.

For example, a fluid supply vessel utilizing capillary flow control may be operated in a duty cycle in which the vessel is in a fluid delivering mode for 10 minutes followed by an off-line state of 10 minute duration, wherein such 10 minute on/10 minute off cycle is repetitively carried out. In such circumstance, the PID signal profile of the mass flow controller, or the mass flow profile itself, may change with each successive on-stream segment of the duty cycle. Accordingly, the CPU may be arranged to monitor such progressive changes and to utilize same in determining the endpoint condition, or otherwise to control supply of fluid in the fluid supply system.

The CPU, as utilized in various implementations of the fluid supply system of the present disclosure, may be arranged to store reference or base line profiles for any of the operating parameters or variables of the fluid supply system, and to utilize monitoring of such parameters or variables, to determine endpoint of the fluid supply vessel, by comparison to the corresponding reference profile parameters or values. In such manner, a reference profile may be utilized to govern system operation in response to dynamically monitored process conditions, outputs of system components, etc.

Figure 4:
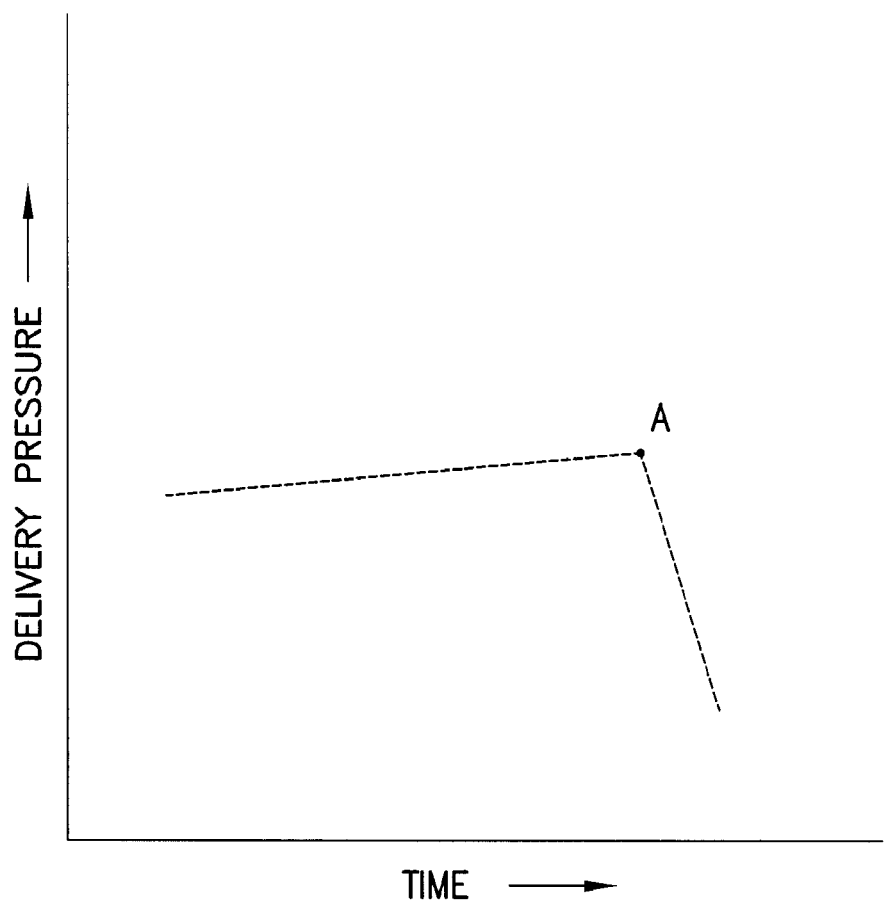
FIG. 4 is a graph of delivery pressure as a function of time, for an illustrative fluid supply vessel utilizing capillary-assisted flow control, in which the graph shows the gradual increase and sudden onset drop in delivery pressure of the fluid being supplied as the vessel reaches an endpoint condition.

FIG. 4 is a graph of delivery pressure, at constant flow conditions, as a function of time, for an illustrative fluid supply vessel utilizing capillary-assisted flow control, in which the graph shows the gradual increase and sudden onset drop in delivery pressure of the fluid being supplied as the vessel nears or reaches an endpoint condition. The delivery pressure curve, as shown, has an inflection point A, at which the delivery pressure is at a maximum value, and subsequently there is a steep drop in delivery pressure, as the vessel rapidly progresses to an exhausted state. This process characteristic can be usefully employed by appropriate monitoring of the delivery pressure, or other variables in the process system showing similar inflection point characteristics at the endpoint condition of the fluid supply vessel, so that the abrupt transition of the monitored characteristic or parameter (corresponding in FIG. 4 to the delivery pressure behavior about point A) is detected and utilized to initiate action that is appropriate to the endpoint condition. This monitoring may involve determination of rate of change of delivery pressure, integration of the delivery pressure curve, or other operations that identify and generate a response to the endpoint condition. Thus, the endpoint can be selected as the condition at the inflection point A on the delivery pressure curve, or at the condition at which the supply vessel pressure is equal to the set point pressure for dispensing, or at any other selected point on the delivery pressure curve before or after point A on such curve.

The disclosure in another aspect relates to a fluid supply system, comprising a fluid supply vessel having an interior volume for holding fluid, first flow circuitry in the interior volume arranged to control flow of fluid during supply of fluid from the vessel, said first flow circuitry including a static flow restricting device and a selectively actuatable valve element, and a second flow circuitry coupled with the vessel for discharging fluid therefrom, wherein the system comprises at least one of the following elements:
  (i) a buffering reservoir in the interior volume of the vessel, coupled with the first flow circuitry, arranged to hold fluid for buffering release thereof to the first flow circuitry;
  (ii) a buffering reservoir exterior of the vessel, coupled with the second flow circuitry, arranged to hold fluid for buffering release thereof to the second flow circuitry;
  (iii) a pressure regulator arranged to regulate fluid pressure in the second flow circuitry;
  (iv) a pressure transducer arranged to monitor fluid pressure in the second flow circuitry; and
  (v) a mass flow controller arranged to control mass flow of fluid in the second flow circuitry
wherein when any one or more of elements (ii)-(v) is comprised in said system, the system may further optionally comprise a CPU programmably arranged to receive at least one monitoring signal from a device monitoring at least one characteristic of the fluid supply vessel or a fluid dispensed therefrom to determine an endpoint of fluid supply from the fluid supply vessel.

Such fluid supply system in one implementation can include mass flow controller (v), wherein an output signal from the mass flow controller is utilized by the CPU to output a control signal to control fluid supply in the system. The output signal from the mass flow controller can for example comprise a PID output signal. In such implementation, or in other implementations, the CPU can be arranged to output a control signal to modulate a flow control valve on the vessel, e.g., in the vessel's valve head, or in the second flow circuitry, or otherwise to terminate flow in the first and/or second flow circuitry. Other implementations will readily suggest themselves, based on the disclosure herein, in which the CPU is arranged to control, to effectuate a transition of the system to accommodate the endpoint condition of the fluid supply vessel, or otherwise to control fluid supply in the fluid supply system.

In the fluid supply vessel in such illustrative implementations, the static flow restricting device can be of any suitable type, and can for example comprise one or more capillary type or flow throttling passages, and the selectively actuatable valve element can comprise a vacuum actuated valve, or alternatively, the fluid supply vessel can be otherwise constituted and arranged as variously described herein. Additional implementations will readily suggest themselves, based on the disclosure herein.

The number of capillaries in various embodiments of the disclosure can be 8 to 10 or more, e.g., from 8 to 50, from 10 to 40, from 12 to 38, from 15 to 35, or other number of capillaries. The capillaries can be 0.25 millimeter or more in internal diameter, e.g., from 0.25 to 5 millimeters, from 0.30 to 4 millimeters, from 0.4 to 3.5 millimeters, from 0.5 to 3.0 millimeters, or other suitable size. The length of the capillaries can be 3.5 inches in length or more, e.g., from 3.5 to 20 inches, from 4 to 10 inches, from 4.5 to 8 inches, from 5 to 7.5 inches, or other suitable length. The fluid supply system fluid dispensing flow rate can be from 250 to 1000 sccm or more, e.g., from 250 to 900 sccm, from 300 to 850 sccm, from 350 to 800 sccm, from 400 to 750 sccm, or other suitable flow rate.

While the disclosure has been has been set out herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A method of determining an endpoint of a fluid supply process, the method comprising:
  selectively establishing fluid flow from a fluid supply vessel;
  controlling fluid flow through a flow passage disposed in an interior volume of the fluid supply vessel with a static flow restricting device and a selectively actuatable valve element upon establishing fluid flow; and
  monitoring at least one characteristic of the fluid supply vessel or a fluid dispensed therefrom to determine the endpoint,
  wherein the static flow restricting device and the selectively actuatable valve element are arranged along the flow passage.

2. The method of claim 1, wherein static flow restricting device comprises a device selected from the group consisting of: (i) one capillary or flow throttling passage; (ii) two or more capillary or flow throttling passages arranged in parallel along a portion of the flow passage; and (iii) a restricted flow orifice.

3. The method of claim 1, wherein the static flow restricting device is positioned at a position selected from the group consisting of: (i) a position before the selectively actuatable valve element on the flow passage; (ii) a position such that the selectively actuatable valve element is positioned between the static flow restricting device and an inlet of the flow passage; (iii) a position after the selectively actuatable valve element on the flow passage; and (iv) a position between the selectively actuatable valve element and an inlet of the flow passage.

4. The method of claim 1, wherein the selectively actuatable valve element comprises a vacuum actuated valve.

5. The method of claim 1, further comprising comparing the monitored characteristic to a reference characteristic to determine the endpoint, wherein the characteristic is selected from at least one of: fluid flow duration, fluid flow rate, fluid pressure, fluid or vessel temperature and concentration of a component of the fluid.

6. The method of claim 1, wherein the endpoint is determined to have been reached when: a) a predetermined fluid flow rate has been detected; b) a predetermined fluid pressure has been detected; c) a predetermined fluid flow duration has been detected; d) a predetermined amount of fluid has been supplied; e) a predetermined change in fluid pressure has been detected; f) a predetermined change in fluid flow rate has been detected; and/or g) a predetermined weight or change of weight of the supply vessel and its contents has been detected.

7. The method of claim 1, further comprising passing the fluid flow from the fluid supply vessel to a fluid-utilizing apparatus comprising an ion implantation apparatus.

8. The method of claim 7, wherein the fluid comprises a fluid species selected from the group consisting of arsine, phosphine, boron trifluoride, boron trichloride, diboron tetrafluoride, diborane, hydrogen selenide, xenon difluoride, silane, polyalkylsilanes, organometallic reagents, fluorine (F2), hydrogen sulfide (H2S), germane (GeH4), and hydrido and alkylhydrido species of Si, Ge, Sn and Sb.

9. The method of claim 6, wherein:
the endpoint predetermined fluid flow rate is in a range of from 0.1 to 5 standard cubic centimeters per minute;
the endpoint predetermined fluid pressure is in a range of from 0 to 760 torr;
the endpoint predetermined fluid flow duration is within a range of from 250 to 550 hours;
the endpoint amount of supplied fluid is in a range of from 250 to 300 grams;
the endpoint change in fluid pressure is in a range of from 10% to 50% of steady state delivery pressure;
the endpoint change in fluid flow rate is in a range of from 1% to 15%; and
the endpoint change of weight of the supply vessel and its contents is in a range of from 15% to 60% in relation to original weight of the fluid supply vessel and fluid therein.

10. The method of claim 1, wherein the monitoring comprises monitoring implanter beam current or ion source arc current in an implanter receiving fluid from said fluid supply vessel, to detect a drop in such current levels, as being indicative of the fluid supply vessel approaching an endpoint state.

11. The method of claim 1, wherein said monitoring and endpoint determination comprise use of a CPU having stored therein a fluid discharge operational profile for the monitored variable(s), as a baseline profile from which actual monitoring data can be assessed for deviations that indicate onset or achievement of a predetermined fluid-depleted state of the fluid supply vessel.

12. The method of claim 1, further comprising accumulating fluid in one or more buffer volumes within or outside the vessel, wherein fluid in said buffer volumes are arranged to be discharged after the endpoint to maintain fluid flow, and wherein the buffer volumes are of sufficient capacity to maintain fluid flow during switchover to a fresh fluid supply vessel.

13. An endpoint monitoring and control apparatus for a fluid supply vessel in which fluid flow is controlled through a flow passage disposed in an interior volume of the fluid supply vessel with a static flow restricting device and a selectively actuatable valve element upon establishing fluid flow, said endpoint monitoring and control apparatus comprising a monitoring unit adapted to monitor at least one characteristic of the fluid supply vessel or a fluid supplied therefrom and to generate an output signal, and a CPU operatively linked in output signal receiving relationship to the monitoring unit, said CPU having stored therein endpoint condition information and responsive in receipt of an output signal from the monitoring unit indicative of the endpoint condition to generate a control signal for use in terminating fluid supply from the fluid supply vessel.

14. The endpoint monitoring and control apparatus of claim 13, further comprising a control device operatively linked in control signal receiving relationship to the CPU and responsive in receipt of the control signal to operate and terminate or assisting to terminate fluid supply from the fluid supply vessel.

15. The endpoint monitoring and control apparatus of claim 13, wherein the endpoint condition information stored in said CPU comprises at least one fluid discharge operational profile for a monitored characteristic of the fluid supply vessel, as a baseline profile from which actual monitoring data can be computationally assessed by the CPU for deviations that indicate onset or achievement of a predetermined fluid-depleted state of the fluid supply vessel.

16. A fluid supply system, comprising a fluid supply vessel having an interior volume for holding fluid, first flow circuitry in the interior volume arranged to control flow of fluid during supply of fluid from the vessel, said first flow circuitry including a static flow restricting device and a selectively actuatable valve element, and a second flow circuitry coupled with the vessel for discharging fluid therefrom, wherein the system comprises at least one of the following elements:
(i) a buffering reservoir in the interior volume of the vessel, coupled with the first flow circuitry, arranged to hold fluid for buffering release thereof to the first flow circuitry;
(ii) a buffering reservoir exterior of the vessel, coupled with the second flow circuitry, arranged to hold fluid for buffering release thereof to the second flow circuitry;
(iii) a pressure regulator arranged to regulate fluid pressure in the second flow circuitry;
(iv) a pressure transducer arranged to monitor fluid pressure in the second flow circuitry; and
(v) a mass flow controller arranged to control mass flow of fluid in the second flow circuitry,
wherein when any one or more of elements (ii)-(v) is comprised in said system, the system optionally further comprises a CPU programmably arranged to receive at least one monitoring signal from a device monitoring at least one characteristic of the fluid supply vessel or a fluid dispensed therefrom to determine an endpoint of fluid supply from the fluid supply vessel.

17. The fluid supply system of claim 16, wherein the system comprises a mass flow controller (v) and said mass flow controller is arranged to output a PID output signal, and the CPU is arranged to output a control signal in response to the PID output signal from the mass flow controller, for control of fluid supply in the system.

18. The fluid supply system of claim 17, wherein the static flow restricting device comprises one or more capillary or flow throttling passages.

19. The fluid supply system of claim 16, wherein the selectively actuatable valve element comprises a vacuum actuated valve.

20. The fluid supply system of claim 16, wherein the selectively actuatable valve element comprises a vacuum actuated valve, and the static flow restricting device comprises from 8 to 50 capillaries, each having an internal diameter of from 0.25 to 5 millimeters, a length of from 3.5 to 20 inches, wherein fluid dispensing flow rate of the fluid supply system is from 250 to 1000 sccm.

\* \* \* \* \*